(12) United States Patent
Lee et al.

(10) Patent No.: US 12,695,461 B2
(45) Date of Patent: Jul. 28, 2026

(54) QUADRATURE NOISE SHAPINGSAR ADC AND OPERATION METHOD THEREOF

(71) Applicant: SAMSUNG ELECTRONICS CO., LTD., Suwon-si (KR)

(72) Inventors: Jongmi Lee, Suwon-si (KR); Jaehoon Lee, Suwon-si (KR); Seongeun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 18/750,104

(22) Filed: Jun. 21, 2024

(65) Prior Publication Data

US 2025/0055469 A1 Feb. 13, 2025

(30) Foreign Application Priority Data

Aug. 11, 2023 (KR) ........................ 10-2023-0105766
Nov. 28, 2023 (KR) ........................ 10-2023-0168469

(51) Int. Cl.
| | |
|---|---|
| *H03M 1/46* | (2006.01) |
| *H03M 1/12* | (2006.01) |
| *H03M 1/30* | (2006.01) |
| *H03M 1/16* | (2006.01) |
| *H03M 1/38* | (2006.01) |

(52) U.S. Cl.
CPC ......... *H03M 1/462* (2013.01); *H03M 1/1245* (2013.01); *H03M 1/303* (2013.01); *H03M 1/16* (2013.01); *H03M 1/38* (2013.01)

(58) Field of Classification Search
CPC .... H03M 1/462; H03M 1/1245; H03M 1/303; H03M 1/38; H03M 1/16
See application file for complete search history.

(56) References Cited

U.S. PATENT DOCUMENTS

| | | | |
|---|---|---|---|
| 9,077,361 B1 * | 7/2015 | Drago ..................... | H03M 1/38 |
| 9,461,661 B1 | 10/2016 | Kull et al. | |
| 9,647,676 B2 | 5/2017 | Srinivasa et al. | |
| 10,790,843 B2 | 9/2020 | Huang | |
| 11,444,631 B2 | 9/2022 | Ali | |
| 11,476,868 B2 | 10/2022 | Tangirala | |
| 11,705,920 B2 | 7/2023 | Sun et al. | |
| 2021/0279039 A1 | 9/2021 | Srivastava | |
| 2021/0399735 A1 | 12/2021 | Wang et al. | |
| 2023/0186979 A1 | 6/2023 | Wei-Li et al. | |

* cited by examiner

*Primary Examiner* — Joseph J Lauture
(74) *Attorney, Agent, or Firm* — Morgan, Lewis & Bockius LLP

(57) ABSTRACT

An analog-to-digital converter ADC includes a first successive approximation register analog-to-digital converter (SAR ADC) configured to convert an in-phase input signal to digital data using a first integrator, a second successive approximation register analog-to-digital converter (SAR ADC) configured to convert a quadrature input signal to digital data using a second integrator, and first to fourth sampling capacitors configured to transmit an output of the first integrator to an input terminal of the second integrator, and transmit an output of the second integrator to an input terminal of the first integrator when the first integrator and the second integrator integrate the sampled in-phase input signal and the quadrature input signal, respectively. The first and second SAR ADCs and the first to fourth sampling capacitors are driven according to an operation sequence of a sampling stage, a conversion stage, and an integration stage.

20 Claims, 10 Drawing Sheets

ANT

R(t)

RF Circuit

1100

Ain

QNS-SAR ADC

1300

Dout

Even Integration (Φ1_INT → H) stage

FIG. 9

Odd_Integration ($\Phi2_{INT} \rightarrow$ H) stage

QUADRATURE NOISE SHAPINGSAR ADC AND OPERATION METHOD THEREOF

CROSS-REFERENCE TO RELATED APPLICATIONS

This application claims priority under 35 U.S.C. § 119 to Korean Patent Application No. 10-2023-0105766 filed on Aug. 11, 2023, and Korean Patent Application No. 10-2023-0168469 filed on Nov. 28, 2023 in the Korean Intellectual Property Office, the disclosures of which are incorporated by reference herein in their entireties.

TECHNICAL FIELD

Embodiments of the present disclosure relate to a semiconductor device, and more particularly, to a noise shaping-successive approximation register NS-SAR analog-to-digital converter ADC capable of frequency shifting, and a method of operating the same.

DISCUSSION OF RELATED ART

An analog-digital converter ADC refers to a device that converts an analog input signal into a digital output signal. A wireless communication system converts a received radio frequency signal into a baseband signal and uses an analog-to-digital converter ADC to generate a digital output signal from the analog baseband signal. Types of these analog-to-digital converters ADCs include flash-type analog-to-digital converters ADCs, successive approximation register SAR analog-to-digital converters ADCs, and delta-sigma modulation (hereinafter referred to as DSM), etc., which are used in applications suited to their respective characteristics.

SUMMARY

Embodiments of the present disclosure provide a noise shaping-successive approximation register NS-SAR analog-to-digital converter ADC capable of frequency shifting and a method of operating the same.

According to an embodiment of the present disclosure, an analog-to-digital converter ADC includes a first successive approximation register analog-to-digital converter (SAR ADC) configured to convert an in-phase input signal to digital data using a first integrator, a second successive approximation register analog-to-digital converter (SAR ADC) configured to convert a quadrature input signal to digital data using a second integrator, and first to fourth sampling capacitors configured to transmit an output of the first integrator to an input terminal of the second integrator, and transmit an output of the second integrator to an input terminal of the first integrator when the first integrator and the second integrator integrate the sampled in-phase input signal and the quadrature input signal, respectively. The first and second SAR ADCs and the first to fourth sampling capacitors are driven according to an operation sequence of a sampling stage, a conversion stage, and an integration stage.

According to an embodiment of the present disclosure, a operation method of the noise shaping successive approximation register analog-to-digital converter NS-SAR ADC includes sampling an in-phase input signal by a first (Capacitive Analog-to-Digital Converter (CADC) of a first SAR ADC and a quadrature input signal by a second CADC of a second SAR ADC, converting the in-phase input signal sampled by the first CADC and the quadrature input signal sampled by the second CADC into digital signals using a first comparator and a second comparator, respectively, and integrating, a combined signal of an in-phase residue remaining in the first CADC and a first cross-couple residue transmitted from the second CADC by a first integrator, and a combined signal of a quadrature residue remaining in the second CADC and a second cross-couple residue transmitted from the first CADC, respectively.

According to an embodiment of the present disclosure, an analog-to-digital converter includes a first noise shaping successive approximation register analog-to-digital converter (NS-SAR ADC) configured to convert an in-phase input signal into digital data, and a second noise shaping successive approximation register analog-to-digital converter (NS-SAR ADC) configured to convert a quadrature input signal into digital data. The first NS-SAR ADC integrates a first residue obtained by subtracting an in-phase output from the in-phase input signal, and the second NS-SAR ADC integrates a second residue obtained by subtracting a quadrature output from the quadrature input signal. A portion of the first residue is transmitted to the second NS-SAR ADC, and a portion of the second residue is transmitted to the first NS-SAR ADC.

BRIEF DESCRIPTION OF THE DRAWINGS

The above and other objects and features of the present disclosure will become more apparent by describing in detail embodiments thereof with reference to the accompanying drawings.

FIG. 1 is a block diagram showing a receiver according to an embodiment of the present disclosure.

FIG. 3 is a circuit diagram showing the structure of a QNS-SAR analog-to-digital converter according to embodiments of the present disclosure for implementing the block diagram of FIG. 2.

FIG. 6 is a circuit diagram showing the main operations in the sampling stage of a QNS-SAR analog-to-digital converter.

FIG. 8 is a circuit diagram showing the operation in the even integration stage of an NS-SAR analog-digital converter.

FIG. 9 is a circuit diagram showing the operation in the odd integration stage of an NS-SAR analog-to-digital converter.

DETAILED DESCRIPTION

Figure 2:
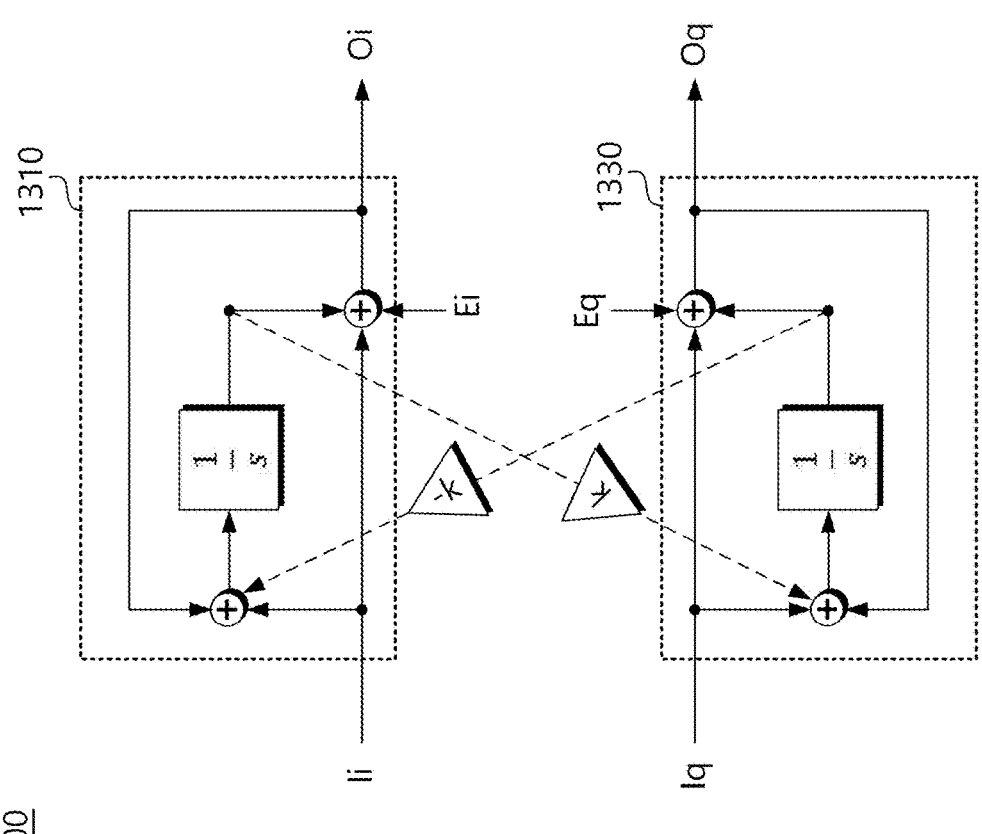
FIG. 2 is a block diagram showing the structure of a quadrature noise shaping successive approximation register (QNS-SAR) analog-to-digital converter of FIG. 1 according to an embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Figure 1:
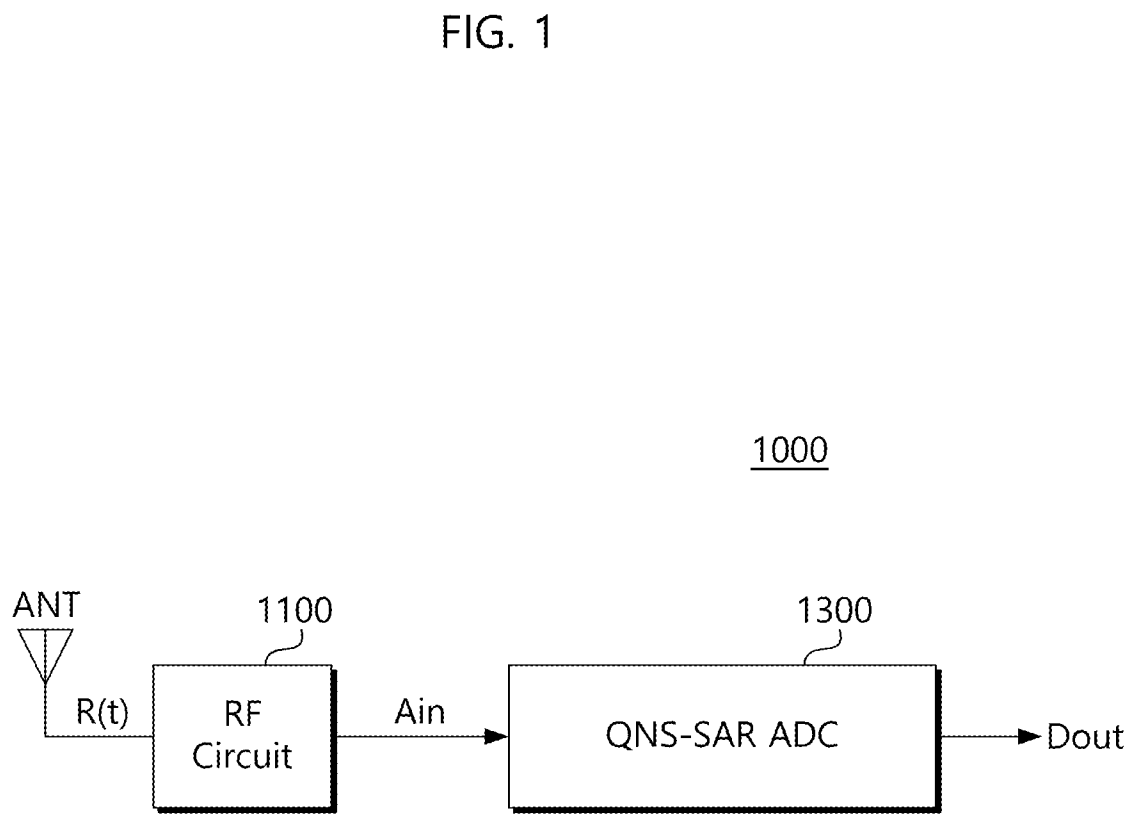

FIG. 1 is a block diagram showing a receiver according to an embodiment of the present disclosure.

Referring to FIG. 1, the receiver 1000 includes an antenna ANT, an RF circuit 1100, and a quadrature noise shaping successive approximation register (Quadrature NS-SAR: hereinafter referred to as QNS-SAR) analog-to-digital converter 1300. The analog-to-digital converter 1300 may also be referred to as an analog-to-digital converter circuit. In an embodiment, the receiver 1000 may refer to a receiving terminal that receives various types of information. However, the present disclosure is not limited thereto. For example, in some embodiments, the receiver 1000 may refer to a transmitting terminal that transmits various types of information or a transceiver that performs both transmitting and receiving functions. Each of the components included in the receiver 1000 may be a hardware block including, for example, an analog circuit and/or a digital circuit, or may be a software block including, for example, a plurality of instructions executed by a processor or the like.

The RF circuit 1100 receives an RF signal R (t) through an antenna ANT. The RF circuit 1100 performs down-conversion on the received RF signal R (t) and converts the signal into a base-band or intermediate frequency band signal. In an embodiment, the RF circuit 1100 may generate the analog input signal Ain through a direct conversion technique that directly converts the RF signal R (t) into a baseband signal.

The QNS-SAR analog-to-digital converter 1300 receives an analog input signal Ain. The QNS-SAR analog-to-digital converter 1300 can convert the received analog input signal Ain into a digital output signal Dout. The QNS-SAR analog-to-digital converter 1300 continuously integrates the difference between input and output (e.g., residue). The QNS-SAR analog-to-digital converter 1300 adds some of the integrated residue to the integrator of the channel (Quadrature) with quadrature phase components and then performs a quantization process.

If the above-described quantization process is analyzed mathematically under the assumption of 1st order shaping, the input is output as is, and only the quantization noise is shaped by the influence of the integrator (1-z-1). If this function is ideal, the transfer function of the quantization noise will be '0' in DC and '2' in 'fs/2 (fs: sampling frequency)'. In other words, if the quantization noise is pushed out to the out-band and then considered only in the filtered in-band, the size of the quantization noise is significantly reduced.

The QNS-SAR analog-to-digital converter 1300 according to embodiments of the present disclosure can shift the frequency of the input signal Ain having an in-phase component and a quadrature component. That is, the QNS-SAR analog-to-digital converter 1300 according to embodiments of the present disclosure applies cross-coupling technology that shifts the frequency of the transfer function. According to cross-coupling technology, the signals of the in-phase path and the quadrature path are crossed at a ratio equal to the intended shifting coefficient and transmitted to the input of the integrator. The transfer function of the QNS-SAR analog-to-digital converter 1300 can be shifted to the target frequency band through cross-connection of the in-phase path and the quadrature path. The cross-connection method of this QNS-SAR analog-to-digital converter 1300 will be described in more detail below.

According to the above-described QNS-SAR analog-to-digital converter 1300, both noise shaping NS and frequency shifting can be implemented. Therefore, according to embodiments of the present disclosure, an analog-to-digital converter ADC with a high signal-to-noise ratio in the intended target band can be implemented.

FIG. 2 is a block diagram showing the structure of the QNS-SAR analog-to-digital converter of FIG. 1 according to an embodiment of the present disclosure.

Referring to FIG. 2, the QNS-SAR analog-to-digital converter 1300 can be modeled as a first integrator 1310 and a second integrator 1330 in each in-phase and quadrature path. Additionally, the output of each of the integrators 1310 and 1330 may be configured in a cross-coupling structure in which the output of each of the integrators 1310 and 1330 is fed back to the input side of the integrators of the opposite phases.

The input signals (Ii, Iq) may be provided as an in-phase input signal Ii and a quadrature input signal Iq, respectively. Each of the integrators 1310 and 1330 will perform an integration operation using the input signals (Ii, Iq) and the fed back signals and then generate an in-phase output signal Oi and a quadrature output signal Oq.

The first integrator 1310 generates the in-phase output signal Oi by adding the in-phase input signal Ii and a residual component that is multiplied by the gain '-k' and cross-connected in the in-phase path. The second integrator 1330 generates the quadrature output signal Oq using a quadrature residual component that is multiplied by the gain 'k' and cross-connected in the quadrature path. The in-phase output signal Oi and the quadrature output signal Oq can be expressed as Equation 1 and Equation 2, respectively.

$$O_i = I_i + \frac{I_i - O_i - (O_q - E_q - I_q)k}{s} + E_i \qquad \text{[Equation 1]}$$

$$O_q = I_q + \frac{I_q - O_q + (O_i - E_i - I_i)k}{s} + E_q \qquad \text{[Equation 2]}$$

By combining Equation 1 and Equation 2, Equation 3 can be summarized as follows.

$$O = I + \frac{s - jk}{(s - jk) + 1}E = O_i + jO_q \qquad \text{[Equation 3]}$$

Referring to Equation 3 above, when providing a cross-connection path of in-phase and quadrature to the NS-SAR analog-digital converter, the frequency shifting of 's–jk' occurs in the quantization noise component 'E'. This characteristic means that frequency shifting has occurred in the noise transfer function NTF.

The QNS-SAR analog-to-digital converter 1300 may use the integrator. Frequency shifting of the noise transfer function NTF of the QNS-SAR analog-to-digital converter 1300 may be possible through the creation of a cross-connection path for signals with in-phase and quadrature paths.

Figure 3:
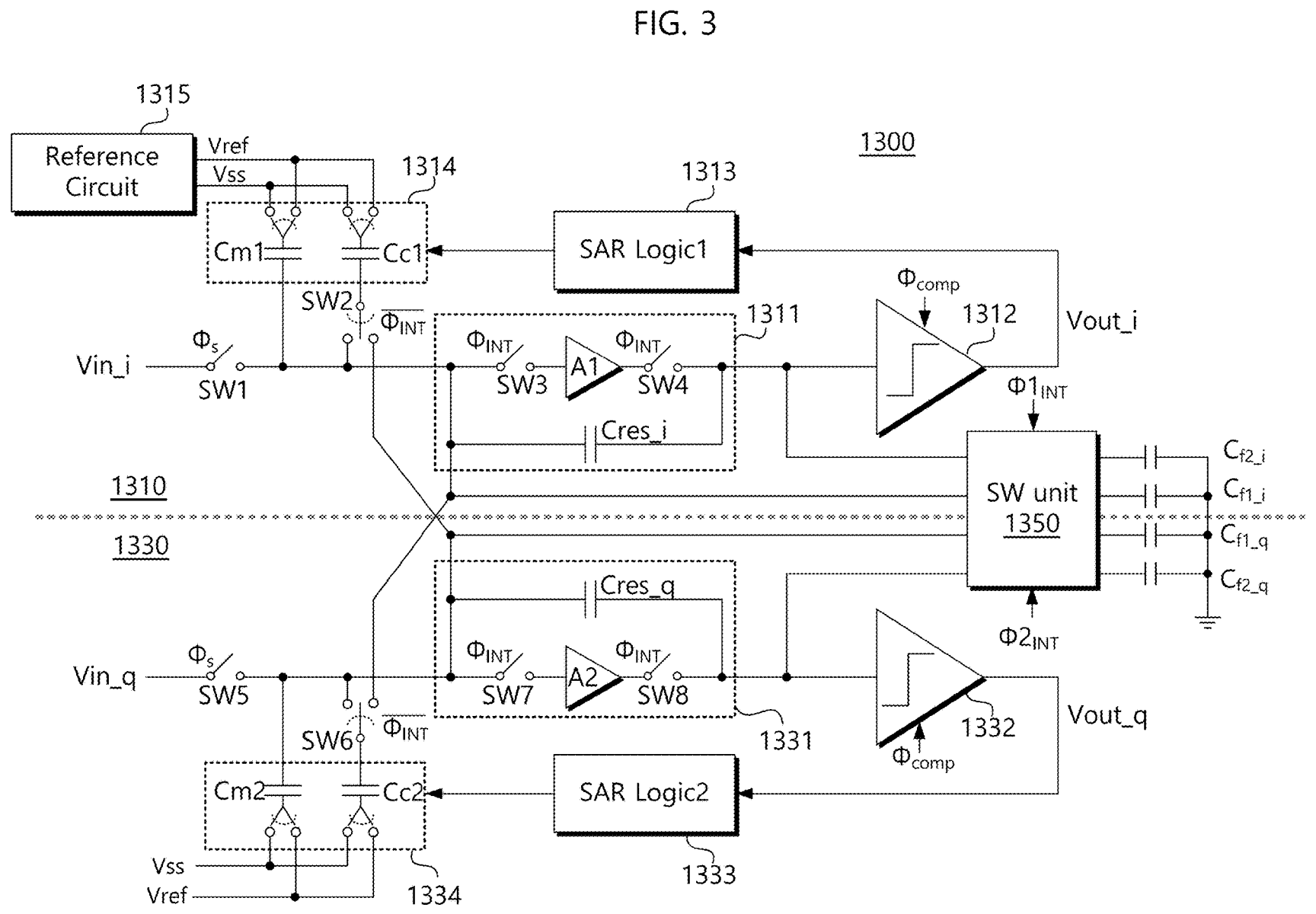

FIG. 3 is a circuit diagram showing the structure of a QNS-SAR analog-to-digital converter according to embodiments of the present disclosure for implementing the block diagram of FIG. 2.

Referring to FIG. 3, the elements constituting the QNS-SAR analog-to-digital converter 1300 may be divided into an in-phase part 1310 and a quadrature part 1330.

The in-phase part 1310 of the QNS-SAR analog-to-digital converter 1300 includes a first SAR integrator 1311, a first comparator 1312, a first SAR logic 1313, a first capacitive digital-to-analog converter (CDAC) 1314, and a reference circuit 1315. The quadrature part 1330 of the QNS-SAR analog-to-digital converter 1300 includes a second SAR integrator 1331, a second comparator 1332, a second SAR logic 1333, and a second CDAC 1334. Here, the reference circuit 1315 is commonly used by the in-phase part 1310 and the quadrature part 1330. The QNS-SAR analog-to-digital converter 1300 includes a switch unit 1350 and capacitors $C_{f1\_i}$, $C_{f1\_q}$, $C_{f2\_i}$, and $C_{f2\_q}$. The switch unit 1350 and the capacitors $C_{f1\_i}$, $C_{f1\_q}$, $C_{f2\_i}$, and $C_{f2\_q}$ may sample the accumulated voltage through infinite impulse response IIR filtering by the SAR integrators 1311 and 1331, or transmit the sampled residual charge to opposite phase part.

The first SAR integrator 1311 of the in-phase part 1310 integrates the residual voltage or residue remaining after the conversion operation in the first CDAC 1314. The first SAR integrator 1311 is a core component of the QNS-SAR analog-to-digital converter 1300. The residue remaining in the first CDAC 1314 after the sampling and conversion stages is accumulated by the first SAR integrator 1311. The accumulated voltage is added in the next conversion stage and used to increase the output resolution of the first comparator 1312. That is, the first SAR integrator 1311 performs an infinite impulse response IIR filtering operation that reflects the results of the previous integration stage into the current integration stage. The first SAR integrator 1311 may include a first residual capacitor Cres_i, switches SW3 and SW4, and a first amplifier A1. The switches SW3 and SW4 may activate or deactivate the first amplifier A1 by the integrator clock signal @INT.

For example, in the integration stage, the first SAR integrator 1311 performs an integration operation reflecting the residue remaining in the first main capacitor Cm1 of the first CDAC 1314 and the residue of the second cross-couple capacitor Cc2 of the second CDAC 1334, and an accumulated residue sampled from the integration result (IIR filtering) of the second SAR integrator 1331 in the previous integration stage. The sampling of the integration of the in-phase residue and the quadrature residue in the first SAR integrator 1311 and integration result using the sampling capacitors $C_{f1\_i}$, $C_{f1\_q}$, $C_{f2\_i}$, and $C_{f2\_q}$ may be performed in the even integration stage.

The first comparator 1312 generates multiple bits of data by combining the residual voltage of the first SAR integrator 1311 with the differential voltage of the input and output provided after being sampled by the first CDAC 1314 in the conversion stage. For example, in response to toggling of the comparator clock signal $\Phi_{comp}$, the first comparator 1312 may output multiple bits of output data.

The first SAR logic 1313 may receive an output signal Vout_i in digital form from the first comparator 1312, and may provide control signals that control the first CDAC 1314 based on the output signal Vout_i. The first SAR logic 1313 connects the first main capacitor Cm1 and the reference circuit 1315 according to the comparison result of the first comparator 1312. In addition, the first SAR logic 1313 connects the cross-couple capacitor Cc1 of the first CDAC 1314 and the reference circuit 1315 according to the comparison result of the first comparator 1312.

The first CDAC 1314 stores the input voltage Vin_i in the capacitors Cm1 and Cc1 in the sampling stage. Here, the main capacitor Cm1 may include a plurality of capacitors (e.g., 8C, 4C, 2C, C) allocated for each bit. In the conversion stage, the voltage sampled at the capacitor 8C corresponding to the MSB is converted to a logical value by the first comparator 1312. Subsequently, a capacitor corresponding to the bit value of the main capacitor Cm1 is sequentially selected according to the comparison result of the first comparator 1312, and the sampled voltage is converted into a bit value.

For example, the first CDAC 1314 includes a first cross-couple capacitor Cc1. The first cross-couple capacitor Cc1 samples the input voltage Vin_i in the sampling stage. In the conversion stage, like the first main capacitor Cm1, the first cross-couple capacitor Cc1 will also transfer the stored voltage to the first comparator 1312. On the other hand, in the integration stage, the first cross-couple capacitor Cc1 will transfer the stored residue to the second SAR integrator 1331 in the quadrature part 1330. For this purpose, a switch SW2 that operates according to the inverted integrator clock signal/$\Phi_{INT}$ is provided. The switch SW2 connects the first cross-couple capacitor Cc1 to the input side of the first SAR integrator 1311 in the sampling and conversion stages, and connects the first cross-couple capacitor Cc1 to the second SAR integrator 1331 in the integration stage. An exemplary configuration of the first CDAC 1314 will be described in more detail below with reference to FIG. 4.

The reference circuit 1315 provides a reference voltage Vref or a common voltage Vss to the first CDAC 1314 and the second CDAC 1334. Based on the reference voltage Vref provided from the first reference circuit 1315, bit strings corresponding to the level of the input voltage Vin_i are sequentially searched for each cycle in which the clock signal $\Phi_{comp}$ of the conversion stage toggles.

The operation characteristics of the second SAR integrator 1331, the second comparator 1332, the second SAR logic 1333, and the second CDAC 1334 included in the quadrature part 1330 are substantially the same as those of the in-phase part 1310. In other words, the second SAR integrator 1331, the second comparator 1332, the second SAR logic 1333, and the second CDAC 1334 operate identically or symmetrically to the first SAR integrator 1311, the first comparator 1312, the first SAR The logic 1313, and the first CDAC 1314. Therefore, for convenience of explanation, a description of the second SAR integrator 1331, the second comparator 1332, the second SAR logic 1333, and the second CDAC 1334 will be omitted.

The switch unit 1350 connects the sampling capacitors $C_{f1\_i}$, $C_{f1\_q}$, $C_{f2\_i}$, and $C_{f2\_q}$ to the output terminals of the SAR integrators 1311 and 1331 depending on the mode or to the input terminals of the SAR integrators of other phases through a cross-couple path. The switch unit 1350 controls sampling and transfer of the sampling capacitors $C_{f1\_i}$, $C_{f1\_q}$, $C_{f2\_i}$, and $C_{f2\_q}$ according to the even integrator clock signal @1$_{INT}$ and the odd integrator clock signal $\Phi2_{INT}$.

For example, in the sampling and conversion stages, the sampling capacitors $C_{f1\_i}$, $C_{f1\_q}$, $C_{f2\_i}$, and $C_{f2\_q}$ are blocked from the input and output terminals of the SAR integrators 1311 and 1331. On the other hand, in the even integration stage in which the even integrator clock signal $\Phi1_{INT}$ is activated, the integration result of the first SAR integrator 1311 should be transmitted to the first sampling capacitor $C_{f2\_i}$, and the integration result of the second SAR integrator 1331 should be transmitted to the fourth sampling capacitor $C_{f2\_q}$. The accumulated residue sampled in the second sampling capacitor $C_{f1\_i}$ in the previous odd integration stage may be cross-transmitted to the input terminal of the second SAR integrator 1331. Additionally, the accumulation residue sampled in the third sampling capacitor $C_{f1\_q}$ in the previous odd integration stage may be cross-transmitted to the input terminal of the first SAR integrator 1311.

In addition, in the odd integration stage in which the odd integrator clock signal $\Phi2_{INT}$ is activated, the integration result of the first SAR integrator 1311 is sampled in the second sampling capacitor $C_{f1\_i}$. In addition, the integration result of the second SAR integrator 1331 is sampled by the third sampling capacitor $C_{f1\_q}$. In addition, the accumulated residue sampled in the first sampling capacitor $C_{f2\_i}$ in the previously performed even integration stage may be cross-transmitted to the input terminal of the second SAR integrator 1331. In addition, the accumulated residue sampled in the fourth sampling capacitor $C_{f2\_q}$ in the previous even integration stage may be cross-transmitted to the input terminal of the first SAR integrator 1311.

Accordingly, the switch unit 1350 is configured to switch the sampling capacitors $C_{f1\_i}$, $C_{f1\_q}$, $C_{f2\_i}$, and $C_{f2\_q}$ to the input and output terminals of the SAR integrators 1311 and 1331 according to the integration stage. The switching characteristics of the switch unit 1350 will be described in more detail through timing diagrams and drawings described below.

The above-described QNS-SAR analog-to-digital converter 1300 may operate in a sampling stage, a conversion stage, and an integration stage. For example, the integration stage is applied as either an even integration stage or an odd integration stage.

First, in the sampling stage, the sampling clock signal Øs is provided as a high level 'H', and the integrator clock signal $\Phi_{INT}$ is provided as a low level 'L'. Then, the switches SW1 and SW5 are turned on, and the first CDAC 1314 and the second CDAC 1334 are charged by the input voltages Vin_i and Vin_q. The switches SW3, SW4, SW7, SW8 that select the amplifiers A1 and A2 in the SAR integrators 1311 and 1331 are turned off by the integrator clock signal @INT. At this time, the comparator clock signal $\Phi_{comp}$ provided to the comparators 1312 and 1332 is inactive, that is, not toggled. Then, sampling occurs in the capacitors of the first CDAC 1314 and the second CDAC 1334 in response to the respective levels of the input voltages Vin_i and Vin_q. The first CDAC 1314 and the second CDAC 1334 each sample the same input voltages Vin_i, Vin_q in the sampling stage, but include separate capacitors Cc1, Cc2 that transfer part of the residual to another phase in the integration stage. The configuration of the first CDAC 1314 and the second CDAC 1334 will be described in detail below with reference to FIG. 4.

In the subsequent conversion stage, the sampling clock signal Øs and the integrator clock signal $\Phi_{INT}$ are provided at a low level 'L'. When the comparator clock signal $\Phi_{comp}$ is toggled, the switches SW1 and SW5 are turned off, and the comparators 1312 and 1332 perform a comparison operation according to the voltage charged in the first CDAC 1314 and the second CDAC 1334. When the comparators 1312 and 1332 output comparison results at every toggling cycle of the comparator clock signal $\Phi_{comp}$, the SAR logics 1313 and 1333 are updated. In the conversion stage, the number of updates of the SAR logics 1313 and 1333 can be adjusted depending on the resolution.

In the subsequent integration stage, after the sampling and conversion stages are completed, the residue remaining in the first CDAC 1314 and the second CDAC 1334 is transmitted to the SAR integrators 1311 and 1331 for saving. For example, in the integration stage according to embodiments of the present disclosure, the residue remaining in the main capacitors Cm1, Cm2 of the first CDAC 1314 and the second CDAC 1334 is integrated into the respective SAR integrators 1311 and 1331. At this time, in order to obtain temporal gain, each of the SAR integrators 1311 and 1331 integrates some of the residue sampled to the cross-couple capacitors Cc1 and Cc2 of the opposite phase and a part of the accumulated residue of the opposite phase with the residue of the main capacitors Cm1 and Cm2. The accumulated residue is the value of the voltage output as a result of the infinite impulse response IIR filtering operation of the SAR integrators 1311 and 1331 in the previous integration stage (even or odd) sampled by the cross-couple capacitors Cc1 and Cc2. To this end, the switch unit 1350 connects the sampling capacitors $C_{f1\_i}$, $C_{f1\_q}$, $C_{f2\_i}$, and $C_{f2\_q}$ to the output terminals of the SAR integrators 1311 and 1331 or to the input terminal of integrators of opposite phases through cross paths according to the even integrator clock signal $\Phi1_{INT}$ and the odd integrator clock signal $\Phi2_{INT}$.

The even integrator clock signal $\Phi_{INT}$ and the odd integrator clock signal $\Phi2_{INT}$ may be activated alternately. For example, after the sampling and conversion stages are performed, an even integration stage in which the even integrator clock signal $\Phi1_{INT}$ is activated may be performed. After the successive sampling and conversion stages are performed, an odd integration stage in which the odd integrator clock signal $\Phi2_{INT}$ is activated may be performed. However, in both the Even Integration stage and the Odd Integration stage, the SAR integrators 1311 and 1331 perform integral or infinite impulse response IIR filtering reflecting the values of the residue of the corresponding phase, the cross residue of the opposite phase, and the accumulated residue.

The first and fourth sampling capacitors $C_{f2\_i}$ and $C_{f2\_q}$ sample the outputs of the SAR integrators 1311 and 1331 of the corresponding phases in the even integration stage. On the other hand, the first and fourth sampling capacitors $C_{f2\_i}$ and $C_{f2\_q}$ transmit the sampled voltage (or accumulated residue) to the input side of the SAR integrators 1311 and 1331 of opposite phases in the odd integration stage. Additionally, the second and third sampling capacitors $C_{f1\_i}$ and $C_{f1\_q}$ transmit the sampled voltage to the input side of the SAR integrators 1311 and 1331 of the corresponding phase in the even integration stage. The second and third sampling capacitors $C_{f1\_i}$ and $C_{f1\_q}$ sample the output values of the SAR integrators 1311 and 1331 of opposite phases in the odd integration stage.

Here, the Even Integration stage and the Odd Integration stage are not performed sequentially, but are operated as an operation loop of 'Sampling→Conversion→Even Integration→Sampling→Conversion→Odd Integration'. That is, in each of the even integration stage and the odd integration stage, the SAR integrators 1311 and 1331 combine and integrate the residue of the corresponding phase, the cross-couple residue of the other phase, and the accumulated residue. The even integration stage or the odd integration stage is divided to alternately sample the output of the SAR integrators 1311 and 1331 to the sampling capacitors $C_{f1\_i}$, $C_{f1\_q}$, $C_{f2\_i}$, and $C_{f2\_q}$.

Above, the configurations of the QNS-SAR analog-to-digital converter 1300 were briefly described. However, the operation of each component of the QNS-SAR analog-todigital converter 1300 at each stage will be described in more detail through the timing diagram described in further detail below.

Figure 4:
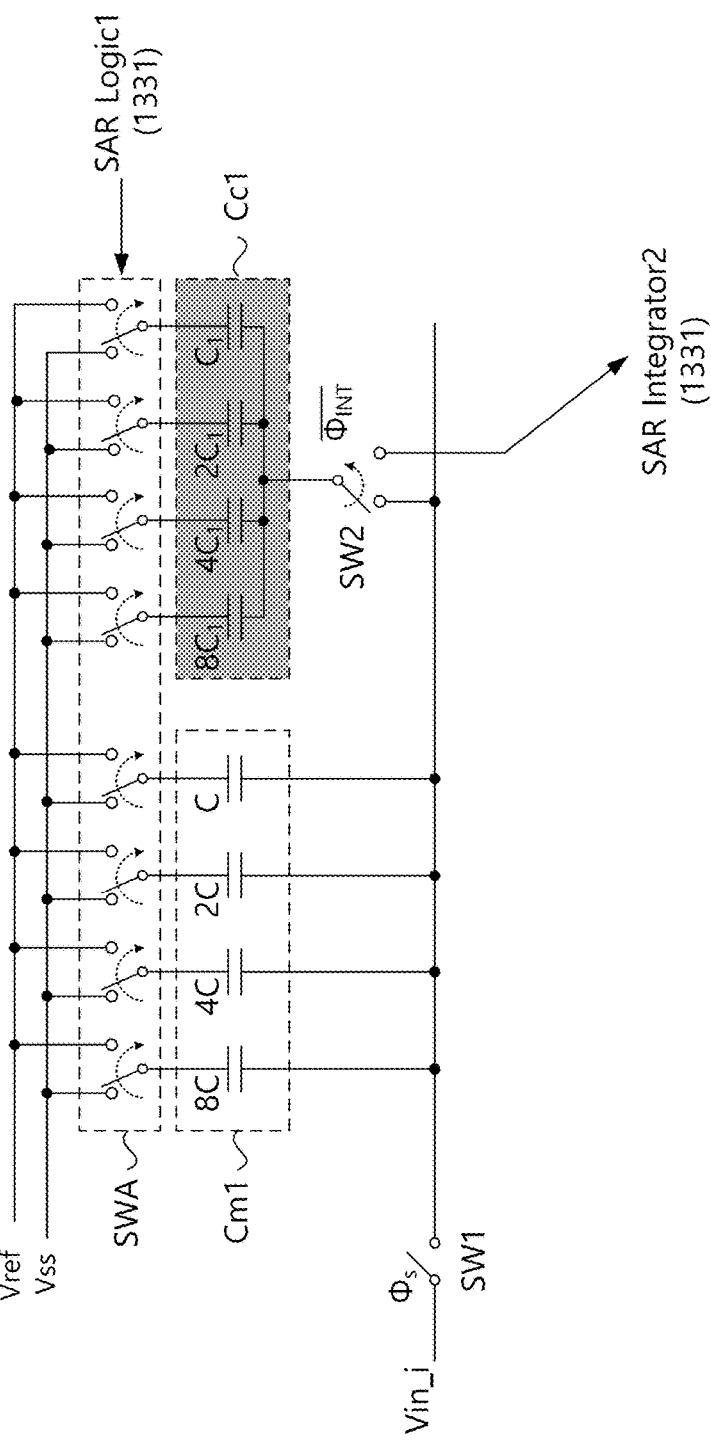
FIG. 4 is a circuit diagram exemplarily showing the structure of a first capacitive digital-to-analog converter (CDAC) of FIG. 3.

FIG. 4 is a circuit diagram exemplarily showing the structure of the first CDAC of FIG. 3. Referring to FIG. 4, the first CDAC 1314 may include a switch array SWA, a first main capacitor Cm1, and a first cross-couple capacitor Cc1.

The switch array SWA transmits the reference voltages Vref and Vss provided from the first reference circuit 1315 under the control of the first SAR logic 1313 to the first main capacitor Cm1 and the first cross-couple capacitor Cc1. After the sampling and conversion stages for the input voltage Vin_i are completed, the first main capacitor Cm1 and the first cross-couple capacitor Cc1 deliver a residual voltage (residue) to the first SAR integrator 1311 and the second SAR integrator 1331. In other words, the residue remaining in the first main capacitor Cm1 is transferred to the first SAR integrator 1311 corresponding to the in-phase. On the other hand, the residue of the first cross-couple capacitor Cc1 will be transferred to the second SAR integrator 1331 corresponding to the quadrature phase. For residual transfer of the first cross-couple capacitor Cc1, the switch SW2 may select one of the in-phase node and the quadrature node according to the inverted integrator clock signal/$\Phi_{INT}$.

The first main capacitor Cm1 may include a plurality of capacitors (e.g., 8C, 4C, 2C, C) allocated for each bit. In the conversion stage, the voltage sampled at the capacitor 8C corresponding to the MSB is converted to a logical value by the first comparator 1312. Subsequently, one of the plurality of capacitors (4C, 2C, and C) is sequentially selected according to the comparison result of the first comparator 1312, and the sampled voltage is converted to a bit value in the first comparator 1312.

The first cross-couple capacitor Cc1 also samples the input voltage Vin_i in the sampling stage. In the conversion stage, one of the plurality of capacitors 8C1, 4C1, 2C1, and C1 is sequentially selected according to the comparison result of the first comparator 1312, similar to the first main capacitor Cm1. At the end of the conversion stage, the same amount of residue remains in the first main capacitor Cm1 and the first cross-couple capacitor Cc1.

On the other hand, in the integration stage, the first cross-couple capacitor Cc1 will transfer the remaining residue to the second SAR integrator 1331 in quadrature part 1330. For this purpose, the switch SW2 that operates according to the inverted integrator clock signal/$\Phi_{INT}$ is provided. The switch SW2 connects the first cross-couple capacitor Cc1 to the input side of the first SAR integrator 1311 in the sampling and conversion stages. The switch SW2 connects the first cross-couple capacitor Cc1 to the input side of the second SAR integrator 1331 in the integration stage. The capacity of the first cross-couple capacitor Cc1 may be smaller than the capacity of the first main capacitor Cm1.

Figure 5:
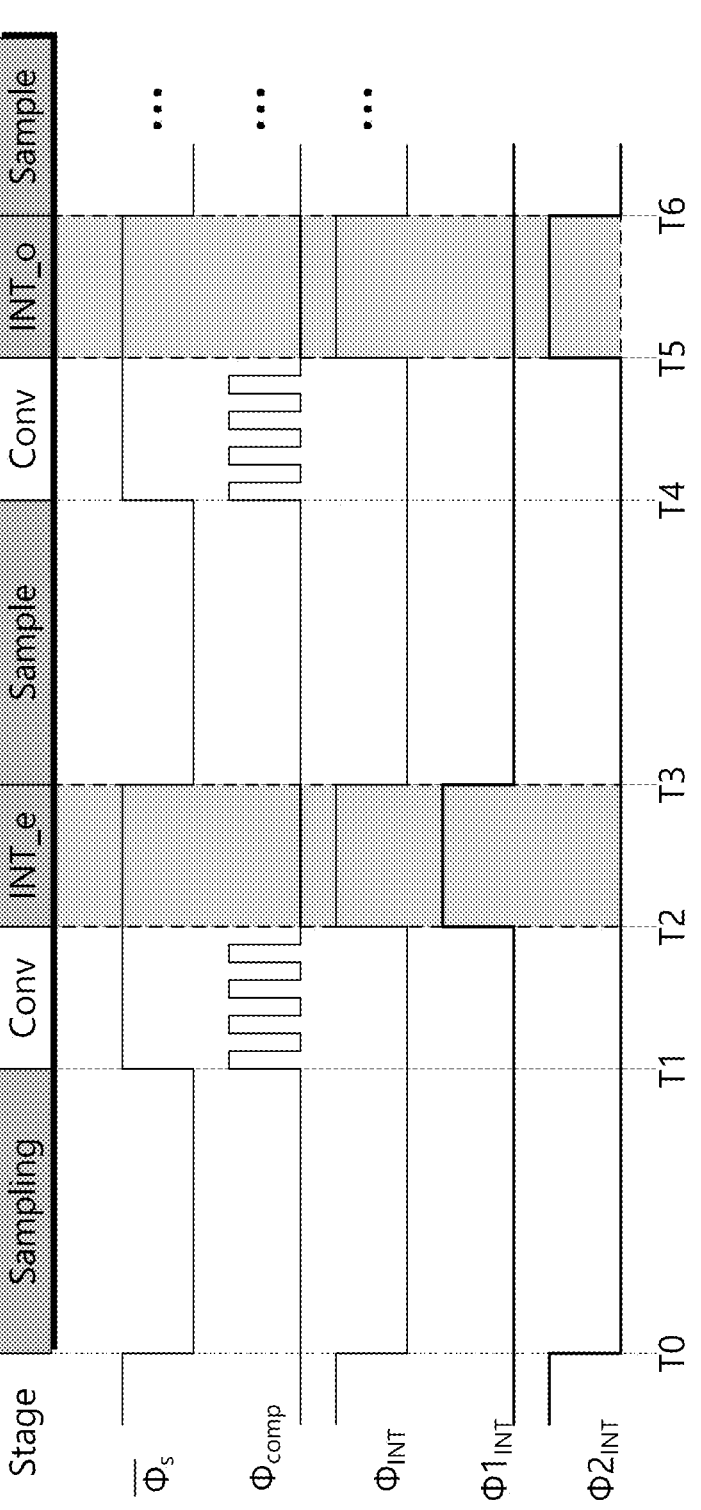
FIG. 5 is a timing diagram showing the operations of a QNS-SAR analog-to-digital converter according to embodiments of the present disclosure.

FIG. 5 is a timing diagram showing the operation stages of the QNS-SAR analog-to-digital converter according to embodiments of the present disclosure. Referring to FIG. 5, the QNS-SAR analog-to-digital converter (1300, see FIG. 3) repeats the operation loop of 'sampling→conversion→even integration→sampling→conversion→odd integration'.

The sampling stage begins at T0. In the sampling stage, the inverted sampling clock signal /$\Phi_S$, the integrator clock signal $\Phi_{INT}$, the even integrator clock signal $\Phi1_{INT}$, and the odd integrator clock signal $\Phi2_{INT}$ are all provided at low level 'L'. When the inverted sampling clock signal /$\Phi_S$ is at a low level 'L', the switches SW1 and SW5 that transfer the input voltage Vin_i and Vin_q to the first CDAC 1314 or the second CDAC 1334 are turned on. During the sampling stage (T0 to T1), the first CDAC 1314 and the second CDAC 1334 are charged by the input voltages Vin_i and Vin_q. The switches SW3, SW4, SW7, SW8 for selecting the amplifiers A1 and A2 in the SAR integrators 1311 and 1331 are turned off by the integrator clock signal $\Phi_{INT}$. During the sampling stage (T0 to T1), the comparator clock signal $\Phi_{comp}$ provided to the comparators 1312 and 1332 is not toggled. Then, the input voltages Vin_i and Vin_q are sampled from the first CDAC 1314 and the second CDAC 1334. The first CDAC 1314 and the second CDAC 1334 each sample the input voltages Vin_i and Vin_q in the sampling stage. However, cross-couple capacitors Cc1 and Cc2 are used to transfer a portion of the residue to the opposite phase in the integration stage (even integration or odd integration).

The conversion stage begins at T1. The inverted sampling clock signal /$\Phi_S$ is disabled to a high level 'H'. Additionally, the integrator clock signal $\Phi_{INT}$, the even integrator clock signal $\Phi1_{INT}$, and the odd integrator clock signal $\Phi2_{INT}$ are deactivated at the low level 'L'. Accordingly, the switches SW1 and SW5 are turned off, and the amplifiers A1 and A2 of the first SAR integrator 1311 and the second SAR integrator 1331 are also blocked. At this time, the sampled voltage transmitted from the first CDAC 1314 and the second CDAC 1334 is transmitted to the first comparator 1312 and the second comparator 1332 via the first residual capacitor Cres_i and the second residue capacitor Cres_q. The first comparator 1312 and the second comparator 1332 sequentially determine the levels transmitted from the first CDAC 1314 and the second CDAC 1334 in response to toggling of the comparator clock signal $\Phi_{comp}$. When the comparators 1312 and 1332 output comparison results every toggling cycle of the comparator clock signal $\Phi_{comp}$, the SAR logics 1313 and 1333 will be updated.

At time T2, the even integration stage begins. In the even integration stage, after the sampling and conversion stages are completed, the residue remaining in the first CDAC 1314 and the second CDAC 1334 is transferred to the SAR integrators 1311 and 1331. At this time, each of the SAR integrators 1311 and 1331 integrates a portion of the residue from the cross-couple capacitors Cc1 and Cc2 of the opposite phase and a portion of the accumulated residue of the opposite phase with the residual transmitted from the main capacitors Cm1 and Cm2.

In other words, in the period T2 to T3, the first SAR integrator 1311 integrates the sum of the residue provided from the first main capacitor Cm1, the cross residue inverted and transmitted from the second cross-couple capacitor Cc2, and the accumulated residue provided from the third sampling capacitor $C_{f1\_q}$. The integration result of the first SAR integrator 1311 will be sampled in the first sampling capacitor $C_{f2\_i}$.

Likewise, in the period T2 to T3, the second SAR integrator 1331 integrates the sum of the residue provided from the second main capacitor Cm2, the cross-couple residue provided from the first cross-couple capacitor Cc1, and the accumulated residue provided from the second sampling capacitor $C_{f1\_i}$. The integration result of the second SAR integrator 1331 will be sampled in the fourth sampling capacitor $C_{f2\_q}$.

At time T3, the same sampling stage as at time T0 continues. That is, the QNS-SAR analog-to-digital converter 1300 operates in the same manner as the sampling stage in the T0 to T1 section. At this time, the inverted sampling clock signal /$\Phi_S$, the integrator clock signal $\Phi_{INT}$, the even integrator clock signal $\Phi1_{INT}$, and the odd integrator clock signal $\Phi2_{INT}$ are all provided at a low level 'L'. When the inverted sampling clock signal /$\Phi_S$ is at a low level 'L', the switches SW1 and SW5 that transfer the input voltage Vin_i and Vin_q to the first CDAC 1314 or the second CDAC 1334 are turned on.

During the sampling stage (T3 to T4), the first CDAC 1314 and the second CDAC 1334 are charged by the input voltages Vin_i and Vin_q. The switches SW3, SW4, SW7, SW8 for selecting the amplifiers A1 and A2 in the SAR integrators 1311 and 1331 are turned off by the integrator clock signal INT. During the sampling stage (T3 to T4), the comparator clock signal $\Phi_{comp}$ provided to the comparators 1312 and 1332 is not toggled. Then, the levels of each of the input voltages Vin_i and Vin_q are sampled in the first CDAC 1314 and the second CDAC 1334 accordingly. The first CDAC 1314 and the second CDAC 1334 each sample the same input voltages Vin_i, Vin_q in the sampling stage, but in the integration stage, the cross-couple capacitors Cc1 and Cc2 are used to transfer the cross-couple residue to the opposite phase.

At time T4, the conversion stage begins. The inverted sampling clock signal /$\Phi_S$ is disabled to a high level 'H'. Additionally, the integrator clock signal $\Phi_{INT}$, the even integrator clock signal $\Phi1_{INT}$, and the odd integrator clock signal $\Phi2_{INT}$ are deactivated at the low level 'L'. Accordingly, the switches SW1 and SW5 are turned off, and the amplifiers A1 and A2 of the first SAR integrator 1311 and the second SAR integrator 1331 are also blocked. At this time, the sampled voltage transmitted from the first CDAC 1314 and the second CDAC 1334 is transmitted to the first comparator 1312 and the second comparator 1332 via the first residual capacitor Cres_i and the second residue capacitor Cres_q. The first comparator 1312 and the second comparator 1332 sequentially determine the levels transmitted from the first CDAC 1314 and the second CDAC 1334 in response to toggling of the comparator clock signal $\Phi_{comp}$. When the comparators 1312 and 1332 output comparison results every toggling cycle of the comparator clock signal $\Phi_{comp}$, the SAR logics 1313 and 1333 will be updated.

At time T5, the odd integration stage begins. In the odd integration stage, after the sampling and conversion stages are completed, the residue remaining in the first CDAC 1314 and the second CDAC 1334 is stored in the SAR integrators 1311 and 1331. At this time, each of the SAR integrators 1311 and 1331 integrates the sum of the residue remaining in the cross-couple capacitors Cc1 and Cc2 of the opposite phase and the accumulated residue of the opposite phase together with the residue delivered from the main capacitors Cm1 and Cm2.

In other words, in the period T5 to T6, the first SAR integrator 1311 integrates the sum of the residue provided from the first main capacitor Cm1, the cross-couple residue inverted and transmitted from the second cross-couple capacitor Cc2, and the accumulated residue provided from the fourth sampling capacitor $C_{f2\_q}$. And the integration result of the first SAR integrator 1311 will be sampled in the second sampling capacitor $C_{f1\_i}$.

Likewise, in the period T5 to T6, the second SAR integrator 1331 integrates the sum of the residue provided from the second main capacitor Cm2, the cross-couple residue provided from the first cross-couple capacitor Cc1, and the accumulated residue provided from the first sampling capacitor $C_{f2\_i}$. The integration result of the second SAR integrator 1331 will be sampled in the third sampling capacitor $C_{f1\_q}$.

At time T6, when the odd integration stage is completed, the operation loop of 'Sampling→Conversion→Even Integration→Sampling→Conversion→Odd Integration' in the QNS-SAR analog-digital converter 1300 is completed. Then, the next operation loop will continue to repeat.

As described above, the QNS-SAR analog-to-digital converter 1300 according to embodiments of the present disclosure performs integration of residues in the 'even integration' or 'odd integration' stage while combining the cross-couple residue and accumulated residue transmitted in other phases. Therefore, the cross-couple path of the in-phase part 1310 and the quadrature part 1330 can be used, and frequency shifting of the noise transfer function NTF is possible. In addition, in the 'even integration' and 'odd integration' stages, the sampling of the integration result occurs substantially simultaneously with the integration operation of the residue. Accordingly, a decrease in operating speed due to the integration operation of the QNS-SAR analog-to-digital converter 1300 can be prevented.

Figure 6:
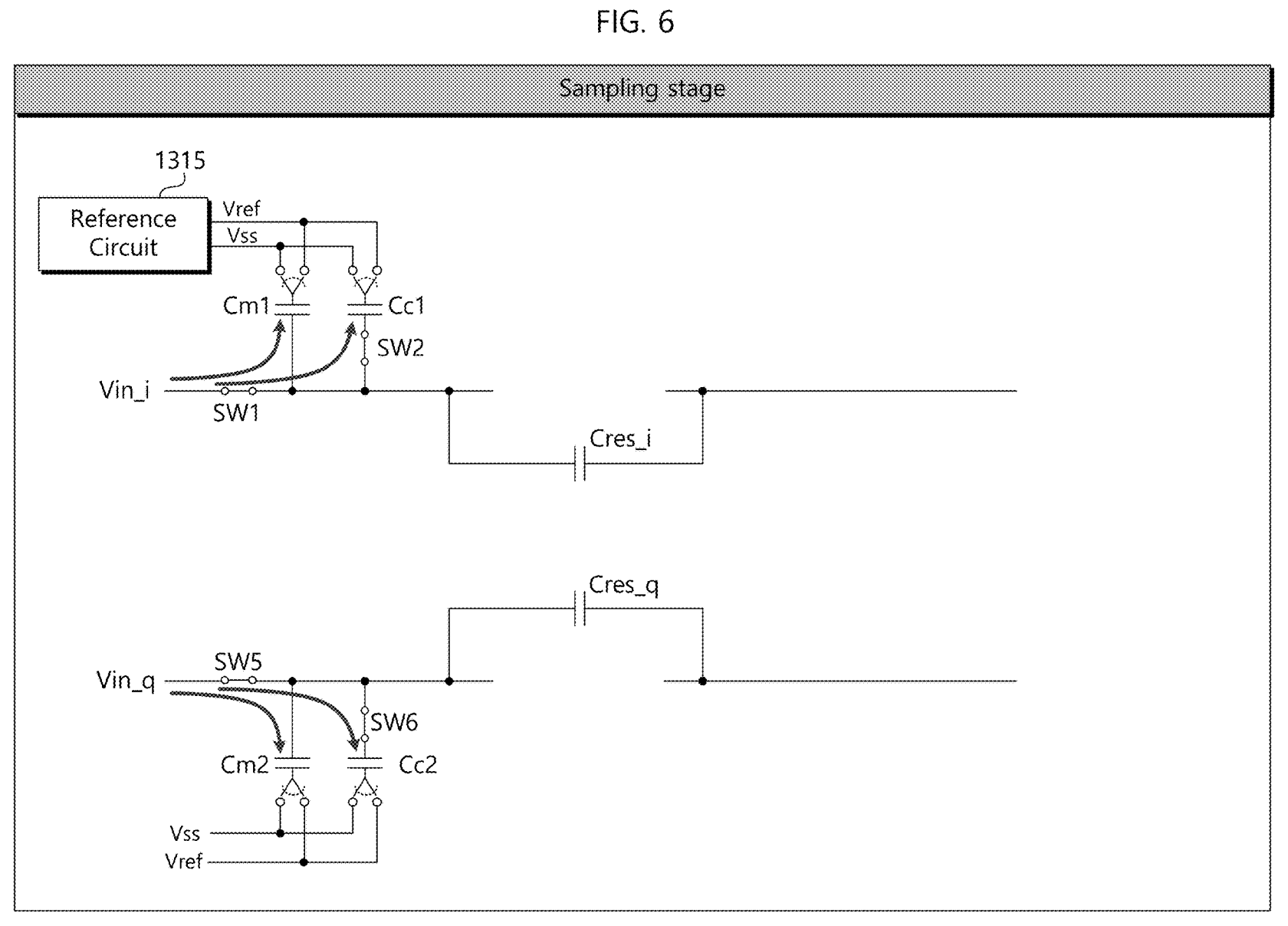

FIG. 6 is a circuit diagram showing the main operations in the sampling stage of the QNS-SAR analog-to-digital converter. Referring to FIG. 6, parts that are deactivated in each operation step are excluded from the circuit.

In the sampling stage, the inverted sampling clock signal /$\Phi_S$, the integrator clock signal $\Phi_{INT}$, the even integrator clock signal $\Phi1_{INT}$, and the odd integrator clock signal $\Phi2_{INT}$ are provided at a low level 'L'. When the inverted sampling clock signal /$\Phi_S$ is at a low level 'L', the switches SW1 and SW5 that transfer the input voltage Vin_i and Vin_q to the first CDAC 1314 or the second CDAC 1334 are turned on. At this time, the capacitors Cm1, Cm2, Cc1, and Cc2 of the first CDAC 1314 and the second CDAC 1334 are charged by the input voltages Vin_i and Vin_q.

Additionally, in the sampling stage, the switches SW3, SW4, SW7, SW8 connecting the amplifiers A1 and A2 in the SAR integrators 1311 and 1331 are turned off by deactivating the integrator clock signal $\Phi_{INT}$. The comparator clock signal $\Phi_{comp}$ provided to the comparators 1312 and 1332 is maintained at a low level 'L' without toggling. Then, in the sampling stage, the comparators 1312 and 1332 and the SAR integrators 1311 and 1331 may be maintained in an inactive state.

Figure 7:
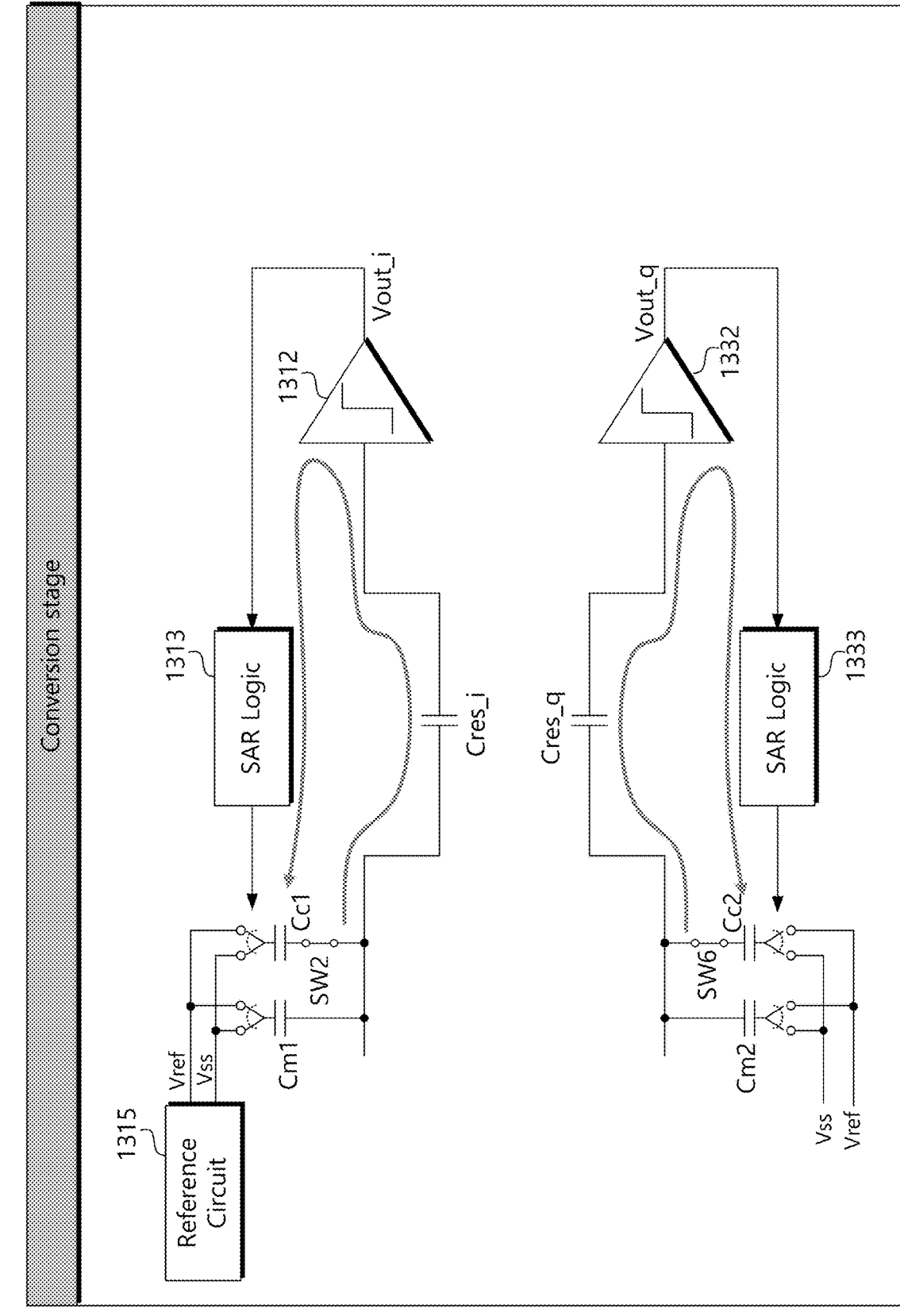
FIG. 7 is a circuit diagram showing the operation in the conversion stage of a noise shaping-successive approximation register (NS-SAR) analog-to-digital converter.

FIG. 7 is a circuit diagram showing the operation in the conversion stage of the NS-SAR analog-to-digital converter. Referring to FIG. 7, configurations or paths that are disabled during the conversion stage are excluded.

During the conversion stage, the inverting sampling clock signal /$\Phi_S$ is deactivated to a high level 'H'. Additionally, the integrator clock signal $\Phi_{INT}$, the even integrator clock signal $\Phi1_{INT}$, and the odd integrator clock signal $\Phi2_{INT}$ are deactivated at the low level 'L'. Accordingly, the switches SW1 and SW5 are turned off, and the input voltages Vin_i and Vin_q are separated from the first CDAC 1314 and the second CDAC 1334. As the switches SW3, SW4, SW7, and SW8 are turned off, the amplifiers A1 and A2 of the first SAR integrator 1311 and the second SAR integrator 1331 are also blocked. At this time, the sampled voltage transmitted from the first CDAC 1314 and the second CDAC 1334 is added to the integrated voltage of the first residue capacitor Cres_i and the second residue capacitor Cres_q to and is transmitted to the first comparator 1312 and second comparator 1332. The first comparator 1312 and the second comparator 1332 sequentially determine the levels transmitted from the first CDAC 1314 and the second CDAC 1334 in response to toggling of the comparator clock signal $\Phi_{comp}$. When the comparators 1312 and 1332 output comparison results every toggling cycle of the comparator clock signal $\Phi_{comp}$, the SAR logics 1313 and 1333 will be updated.

Figure 8:
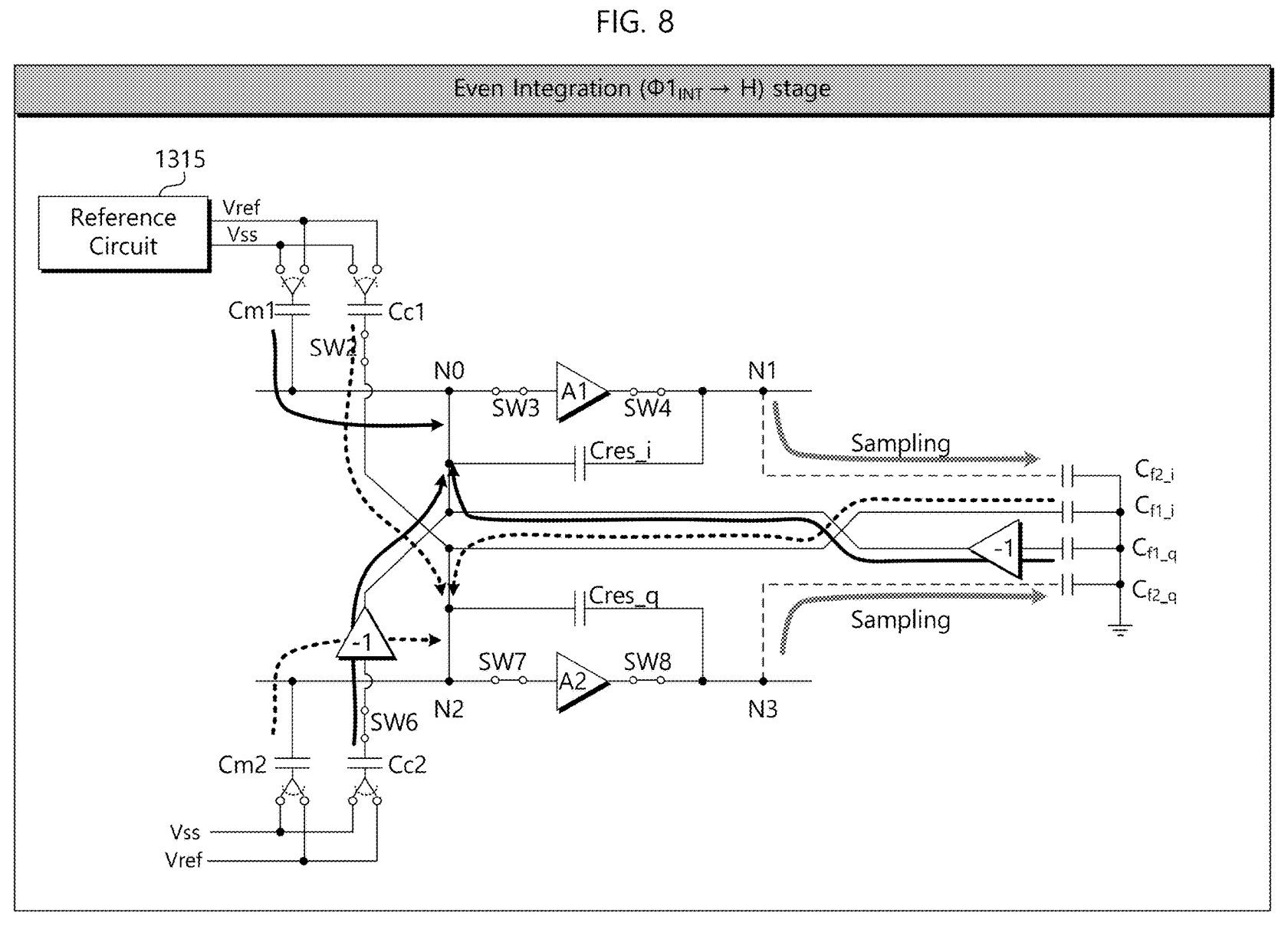

FIG. 8 is a circuit diagram showing the operation in the even integration stage of the NS-SAR analog-digital converter. Referring to FIG. 8, configurations or paths that are deactivated in the even integration stage are excluded.

When the even integration stage starts after the sampling and conversion stages are completed, the residue remaining in the first CDAC 1314 and the second CDAC 1334 is stored in the SAR integrators 1311 and 1331. At this time, each of the SAR integrators 1311 and 1331 receives the cross-couple residue from the cross-couple capacitors Cc1 and Cc2 and the accumulated residue from the sampling capacitors $C_{f1\_i}$ and $C_{f1\_q}$ of opposite phases. Each of the SAR integrators 1311 and 1331 integrates the received cross-couple residue and accumulated residue together with the residue transmitted from the main capacitors Cm1 and Cm2.

In the even integration stage, the first SAR integrator 1311 integrates the sum of the residue provided from the first main capacitor Cm1, cross-couple residue inverted and transmitted from the second cross-couple capacitor Cc2, and the accumulated residue provided from the third sampling capacitor $C_{f1\_q}$. That is, signals are transmitted from the first main capacitor Cm1, the second cross-couple capacitor Cc2, and the third sampling capacitor $C_{f1\_q}$ to the node NO corresponding to the input terminal of the first SAR integrator 1311. The signals transmitted through the three paths are integrated by the first SAR integrator 1311. The integration result of the first SAR integrator 1311 is transmitted to the output node N1 of the first SAR integrator 1311 and sampled by the first sampling capacitor $C_{f2\_i}$. Here, the accumulated residue provided from the third sampling capacitor $C_{f1\_q}$ corresponds to a sampling value of the integration result of the second SAR integrator 1331 in the previous odd integration stage.

Likewise, the second SAR integrator 1331 combines the residue provided from the second main capacitor Cm2, the cross-couple residual provided from the first cross-couple capacitor Cc1, and the accumulation provided from the second sampling capacitor $C_{f1\_i}$ for integration. Signals are transmitted from the second main capacitor Cm2, the first cross-couple capacitor Cc1, and the second sampling capacitor $C_{f1\_i}$ to the input terminal N2 of the second SAR integrator 1331. The voltages transmitted through the three paths are integrated by the second SAR integrator 1331. The integration result of the second SAR integrator 1331 will be delivered to the output node N3 of the second SAR integrator 1331 and sampled in the fourth sampling capacitor $C_{f2\_q}$. Here, the accumulation residue provided from the second sampling capacitor $C_{f1\_i}$ corresponds to the sampling value of the integration result of the first SAR integrator 1311 in the previous odd integration stage.

Figure 9:
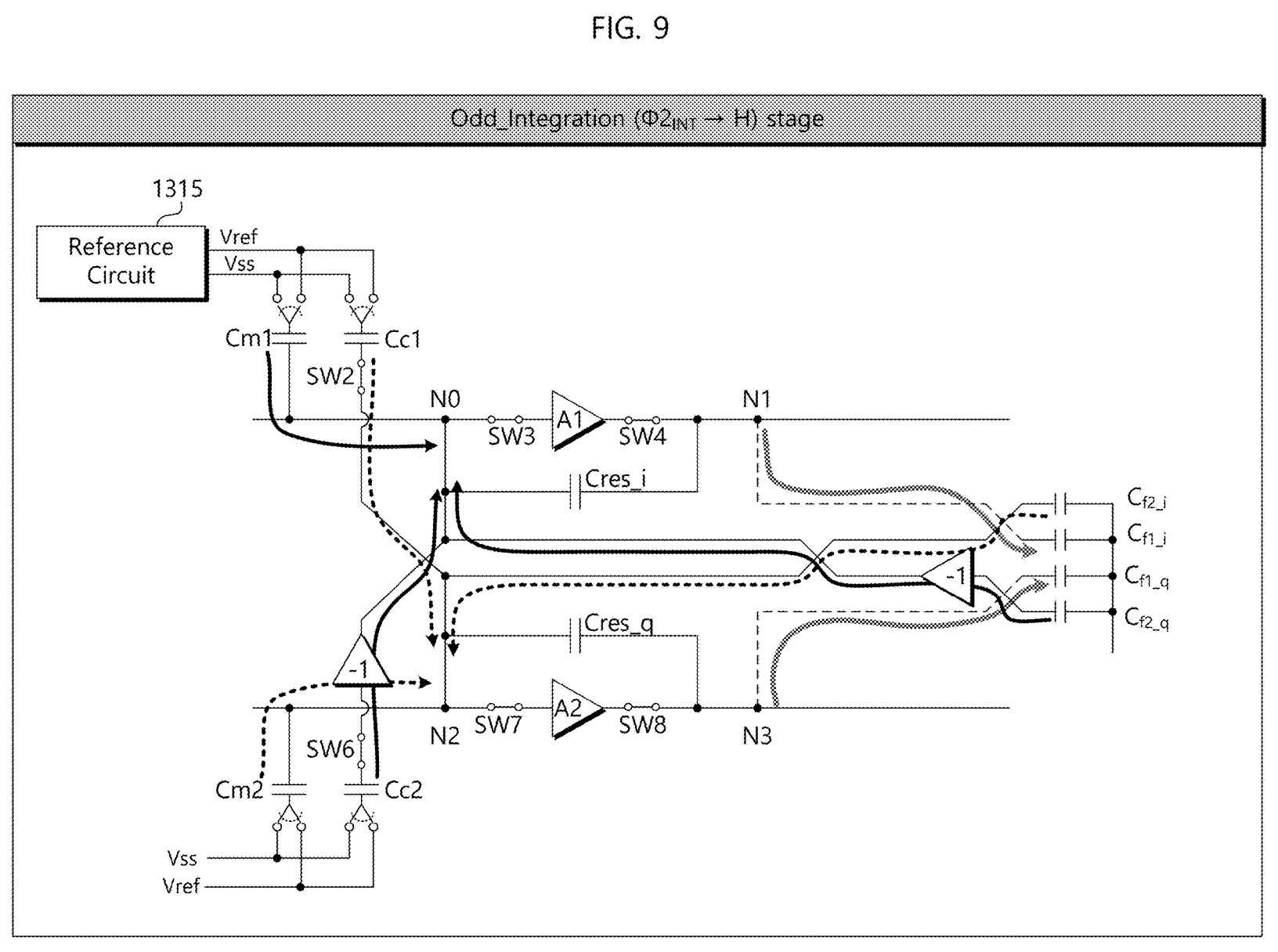

FIG. 9 is a circuit diagram showing the operation in the odd integration stage of the NS-SAR analog-to-digital converter. Referring to FIG. 9, configurations or paths that are deactivated in the odd integration stage are excluded.

When the odd integration stage begins after the sampling and conversion stages are completed, the residue remaining in the first CDAC 1314 and the second CDAC 1334 is stored into the SAR integrators 1311 and 1331. At this time, each of the SAR integrators 1311 and 1331 receives the cross-couple residue from the cross-couple capacitors Cc1 and Cc2 and the accumulated residue from the sampling capacitors $C_{f2\_i}$ and $C_{f2\_q}$ of opposite phases. Each of the SAR integrators 1311 and 1331 integrates the received cross-couple residue and accumulated residue together with the residue transmitted from the main capacitors Cm1 and Cm2.

In the odd integration stage, the first SAR integrator 1311 integrates the sum of the residue provided from the first main capacitor Cm1, the cross-couple residue inverted and transmitted from the second cross-couple capacitor Cc2, and the accumulated residue provided from the fourth sampling capacitor $C_{f2\_q}$. That is, residues transmitted from the first main capacitor Cm1, the second cross-couple capacitor Cc2, and the fourth sampling capacitor $C_{f2\_q}$ are input to the input terminal NO of the first SAR integrator 1311. The residues transmitted through the three paths are integrated by the first SAR integrator 1311. The integration result of the first SAR integrator 1311 is transmitted to the output node N1 of the first SAR integrator 1311 and sampled by the second sampling capacitor $C_{f1\_i}$. Here, the accumulation residue provided from the fourth sampling capacitor $C_{f2\_q}$ corresponds to the sampled value of the output of the second SAR integrator 1331 in the previous even integration stage.

Likewise, the second SAR integrator 1331 combines the residue provided from the second main capacitor Cm2, the cross-couple residue provided from the first cross-couple capacitor Cc1, and the accumulation provided from the first sampling capacitor $C_{f2\_i}$ for integration operation. Voltages are transmitted from the second main capacitor Cm2, the first cross-couple capacitor Cc1, and the first sampling capacitor $C_{f2\_i}$ to the input terminal N2 of the second SAR integrator 1331. The voltages transmitted through the three paths are integrated by the second SAR integrator 1331. The integration result of the second SAR integrator 1331 will be delivered to the output node N3 of the second SAR integrator 1331 and sampled by the third sampling capacitor $C_{f1\_q}$. Here, the accumulated voltage provided from the first sampling capacitor $C_{f2\_i}$ corresponds to the value at which the output of the first SAR integrator 1311 was sampled in the previous odd integration stage.

Figure 10:
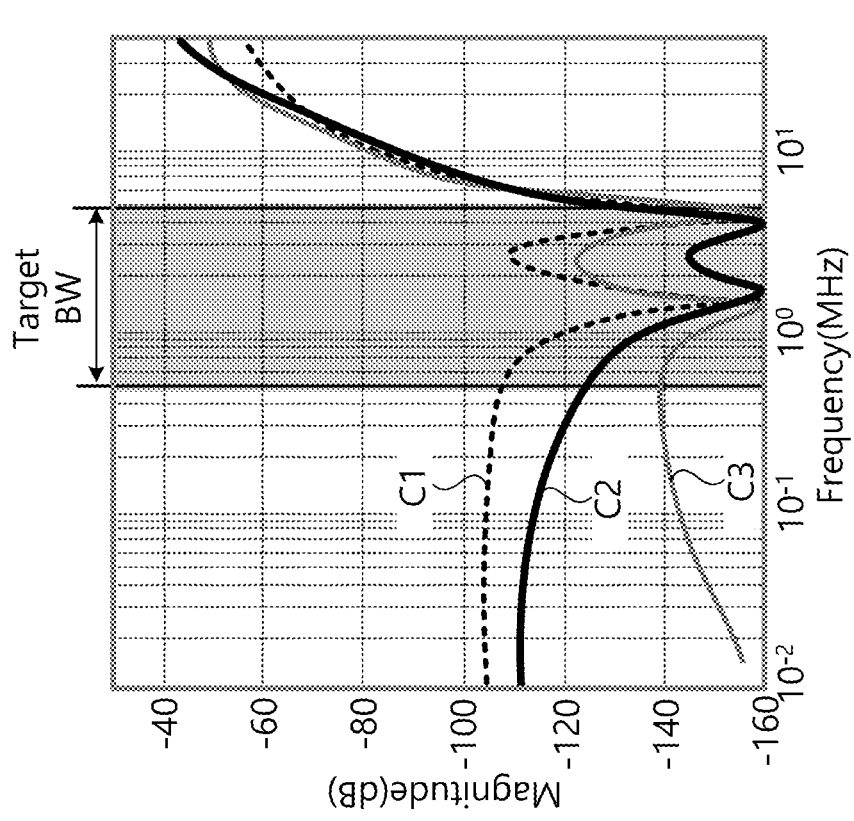
FIG. 10 is a graph showing the noise transfer function of the quadrature noise shaping successive approximation register analog-to-digital converter QNS-SAR ADC according to embodiments of the present disclosure.

FIG. 10 is a graph showing the noise transfer function when the present disclosure is applied to the quantizer of a delta-sigma modulator. Referring to FIG. 10, when using the QNS-SAR ADC according to embodiments of the present disclosure, the noise transfer function NTF can be shifted to the target band by cross-connecting in-phase and quadrature integrators. Through this, the noise transfer characteristics of the noise shaping successive approximation register analog-to-digital converter (QNS-SAR ADC) can be sufficiently improved in the target bandwidth (Target BW).

Curve 'C1' shows the noise transfer function when using a typical successive approximation register analog-to-digital converter SAR ADC. Curve 'C2' shows the noise transfer function of a noise shaping successive approximation register analog-to-digital converter NS-SAR ADC. And curve 'C3' shows the noise transfer function of the quadrature noise shaping successive approximation register analog-to-digital converter QNS-SAR ADC according to embodiments of the present disclosure. In the target band, it can be seen that the noise of the quadrature noise shaping successive approximation register analog-to-digital converter QNS-SAR ADC according to embodiments of the present disclosure is the lowest.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. An analog-to-digital converter (ADC), comprising:
a first successive approximation register analog-to-digital converter (SAR ADC) configured to convert an in-phase input signal to digital data using a first integrator;
a second successive approximation register analog-to-digital converter (SAR ADC) configured to convert a quadrature input signal to digital data using a second integrator; and
first to fourth sampling capacitors configured to transmit an output of the first integrator to an input terminal of the second integrator, and transmit an output of the second integrator to an input terminal of the first integrator when the first integrator and the second integrator integrate the converted in-phase input signal and the converted quadrature input signal, respectively,
wherein the first and second SAR ADCs and the first to fourth sampling capacitors are driven according to an operation sequence of a sampling stage, a conversion stage, and an integration stage.

2. The ADC of claim 1, wherein the first SAR ADC includes a first Capacitive Analog-to-Digital Converter (CADC) that samples the in-phase input signal, and the second SAR ADC includes a second CADC that samples the quadrature input signal,
wherein the first CADC includes a first main capacitor and a first cross-couple capacitor, and
the second CADC includes a second main capacitor and a second cross-couple capacitor.

3. The ADC of claim 2, wherein in the conversion stage, the first main capacitor and the first cross-couple capacitor are connected to a first comparator, and the second main capacitor and the second cross-couple capacitor are connected to a second comparator.

4. The ADC of claim 3, wherein in the integration stage, the first main capacitor is connected to the first integrator, the first cross-couple capacitor is connected to the second integrator, the second main capacitor is connected to the second integrator, and the second cross-couple capacitor is connected to the second integrator.

5. The ADC of claim 4, wherein in the integration stage:
the first sampling capacitor is configured to sample an integration result of the first integrator, and the fourth sampling capacitor is configured to sample an integration result of the second integrator,
the second sampling capacitor is configured to transmit the integration result of the first integrator sampled in a previous integration stage to the second integrator, and
the third sampling capacitor is configured to transmit the integration result of the second integrator sampled in the previous integration stage to the first integrator.

6. The ADC of claim 5, wherein in the previous integration stage:
the second sampling capacitor is configured to sample an integration result of the first integrator, and the third sampling capacitor is configured to sample an integration result of the second integrator,
the first sampling capacitor is configured to transmit the sampled integration result of the first integrator to the second integrator, and
the fourth sampling capacitor is configured to transmit the sampled integration result of the second integrator to the first integrator.

7. The ADC of claim 6, further comprising:
a switch unit configured to connect the first to fourth sampling capacitors to the input terminal or the output terminal of the first integrator and the second integrator in the integration stage and the previous integration stage.

8. The ADC of claim 6, wherein the sampling stage and the conversion stage are performed between the previous integration stage and the integration stage.

9. The ADC of claim 2, further comprising:
a first cross-couple switch configured to connect the first cross-couple capacitor to the input terminal of the second integrator in the integration stage; and
a second cross-couple switch configured to connect the second cross-couple capacitor to the input terminal of the first integrator in the integration stage.

10. An operation method of a noise shaping successive approximation register analog-to-digital converter (NS-SAR ADC), comprising:
sampling an in-phase input signal by a first Capacitive Analog-to-Digital Converter (CADC) of a first successive approximation register analog-to-digital converter (SAR ADC) and a quadrature input signal by a second CADC of a second SAR ADC;
converting the in-phase input signal sampled by the first CADC and the quadrature input signal sampled by the second CADC into digital signals using a first comparator and a second comparator, respectively; and
integrating, a combined signal of an in-phase residue remaining in the first CADC and a first cross-couple residue transmitted from the second CADC by a first integrator, and a combined signal of a quadrature residue remaining in the second CADC and a second cross-couple residue transmitted from the first CADC, respectively.

11. The method of claim 10, wherein when integrating, an integration result of the first integrator sampled in a previous integration operation is transmitted to the second integrator, and an integration result of the second integrator sampled in the previous integration operation is transmitted to the first integrator.

12. The method of claim 11, wherein when integrating, the integration result of the first integrator and the integration result of the second integrator are sampled in corresponding sampling capacitors.

13. The method of claim 11, wherein when integrating, the integration result of the first integrator is sampled, and the integration result of the first integrator sampled in the previous integration step is cross-transferred to the input terminal of the second integrator.

14. The method of claim 13, wherein when integrating, the integration result of the second integrator is sampled, and the integration result of the second integrator sampled in the previous integration step is cross-transferred to the input terminal of the first integrator.

15. The method of claim 10, wherein the second cross-couple residue is inverted and transmitted to the second integrator.

16. An analog-to-digital converter, comprising:

a first noise shaping successive approximation register analog-to-digital converter (NS-SAR ADC) configured to convert an in-phase input signal into digital data; and a second noise shaping successive approximation register analog-to-digital converter (NS-SAR ADC) configured to convert a quadrature input signal into digital data, wherein the first NS-SAR ADC integrates a first residue obtained by subtracting an in-phase output from the in-phase input signal, and the second NS-SAR ADC integrates a second residue obtained by subtracting a quadrature output from the quadrature input signal, wherein a portion of the first residue is transmitted to the second NS-SAR ADC, and a portion of the second residue is transmitted to the first NS-SAR ADC.

17. The ADC of claim 16, wherein the first NS-SAR ADC includes a first cross-couple capacitor that samples and transmits the portion of the first residue, and the second NS-SAR ADC includes a second cross-couple capacitor that samples and transmits the portion of the second residue.

18. The ADC of claim 17, wherein the portion of the second residue is inverted and transmitted to the integrator of the first NS-SAR ADC.

19. The ADC of claim 17, further comprising:

a first cross-couple switch configured to connect the first cross-couple capacitor to an input terminal of the in-phase input signal during a sampling operation, and connect the first cross-couple capacitor to an integrator of the second NS-SAR ADC during an integration operation; and a second cross-couple switch configured to connect the second cross-couple capacitor to an input terminal of the quadrature input signal during the sampling operation, and connect the second cross-couple capacitor to an integrator of the first NS-SAR ADC during the integration operation.

20. The ADC of claim 19, further comprising:

a plurality of sampling capacitors configured to transmit an integration result of the first NS-SAR ADC to an input terminal of the integrator of the second NS-SAR ADC, and configured to transmit an integration result of the second NS-SAR ADC to an input terminal of the integrator of the first NS-SAR ADC, when integrating the in-phase input signal and the quadrature input signal.

* * * * *